US009240362B2

(12) United States Patent
Chidambaram et al.

(10) Patent No.: US 9,240,362 B2
(45) Date of Patent: Jan. 19, 2016

(54) LAYER ARRANGEMENT AND A WAFER LEVEL PACKAGE COMPRISING THE LAYER ARRANGEMENT

(71) Applicant: Agency for Science, Technology and Research, Singapore (SG)

(72) Inventors: Vivek Chidambaram, Singapore (SG); Ling Xie, Singapore (SG); Ranganathan Nagarajan, Singapore (SG); Bangtao Chen, Singapore (SG); Beng Yeung Ho, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 14/372,015

(22) PCT Filed: Jun. 18, 2013

(86) PCT No.: PCT/SG2013/000252
§ 371 (c)(1),
(2) Date: Jul. 12, 2014

(87) PCT Pub. No.: WO2013/191656
PCT Pub. Date: Dec. 27, 2013

(65) Prior Publication Data
US 2015/0130039 A1    May 14, 2015

(30) Foreign Application Priority Data
Jun. 20, 2012    (SG) .................................. 201204609

(51) Int. Cl.
*H01L 23/20*    (2006.01)
*H01L 23/26*    (2006.01)
(Continued)

(52) U.S. Cl.
CPC .............. *H01L 23/26* (2013.01); *B81B 7/0038* (2013.01); *B81C 1/00285* (2013.01); *C22C 14/00* (2013.01); *C22C 19/03* (2013.01); *H01L 2924/0002* (2013.01)

(58) Field of Classification Search
CPC ............ H01L 23/26; H01L 2924/0002; B81C 1/00285; B81B 7/0038; C22C 14/00; C22C 19/03
See application file for complete search history.

(56) References Cited

U.S. PATENT DOCUMENTS 5,242,478 A * 9/1993 Sun ........................ G02B 6/132
                                                    65/374.15
6,416,560 B1 * 7/2002 Palmgren ................. B24D 3/10
                                                    51/293

(Continued)

FOREIGN PATENT DOCUMENTS

| WO | 03028096 A2 | 4/2003 |
| WO | WO-03/028096 | 4/2003 |

OTHER PUBLICATIONS

Moraja et. al., "Getters Films at Wafer Level for Wafer to Wafer Bonded MEMS," Proceedings of the Design, Test, Integration and Packaging of MEMS/MOEMS, 2003, pp. 346-349.

(Continued)

*Primary Examiner* — Victor A Mandala
(74) *Attorney, Agent, or Firm* — Winstead, P.C.

(57) ABSTRACT

The invention relates to a layer arrangement and a wafer level package comprising the layer arrangement, and in particular, the layer arrangement comprises a getter layer and further comprises a sacrificial layer. The wafer level package may be used in microelectromechanical systems (MEMS) packaging at a vacuum level of about 10 mTorr or less such as close to 1 mTorr (i.e. MEMS vacuum packaging).

20 Claims, 2 Drawing Sheets

(51) Int. Cl.
*C22C 14/00* (2006.01)
*C22C 19/03* (2006.01)
*B81B 7/00* (2006.01)
*B81C 1/00* (2006.01)

(56) References Cited

U.S. PATENT DOCUMENTS

| | | |
|---|---|---|
| 6,923,625 B2 | 8/2005 | Sparks |
| 7,749,871 B2 * | 7/2010 | Elers .................. C23C 16/32 438/471 |
| 2009/0148635 A1 | 6/2009 | Coda et al. |
| 2009/0215610 A1 | 8/2009 | Kullberg et al. |
| 2010/0178419 A1 | 7/2010 | Baillin |
| 2012/0033348 A1 | 2/2012 | Giannantonio et al. |

OTHER PUBLICATIONS

Chen et. al., "NanoGetters for MEMS Hermetic Packaging," Proceedings of the 7th IEEE International Conference on Nanotechnology, Aug. 2-5, 2007, Hong Kong, pp. 921-924.

Giorgi et. al., "High-Porosity Thick-Film Getters," IEEE Transactions on Electron Devices, vol. 36, No. 11, Nov. 1989, pp. 2744-2747.

International Search Report—mailed Sep. 6, 2013—Australian Patent Office.

* cited by examiner

LAYER ARRANGEMENT AND A WAFER LEVEL PACKAGE COMPRISING THE LAYER ARRANGEMENT

CROSS-REFERENCE TO RELATED APPLICATION

This application claims the benefit of priority of Singapore Patent Application No. 201204609-0, filed Jun. 20, 2012, the contents of which being hereby incorporated by reference in its entirety for all purposes.

TECHNICAL FIELD

The invention relates to a layer arrangement and a wafer level package comprising the layer arrangement, and in particular, the layer arrangement comprises a getter layer. The wafer level package may be used in microelectromechanical systems (MEMS) packaging at a vacuum level of about 10 mTorr or less such as close to 1 mTorr (i.e. MEMS vacuum packaging).

BACKGROUND

MEMS vacuum packaging, the technology for providing gas-tightness enclosure with an internal tiny cavity, has been a key technology for various MEMS devices and systems. Vacuum packaging protects micro devices and systems from external environments and allows easy handling. The stability of pressure is very important to ensure the dynamic performance of MEMS devices. Wafer level MEMS packaging is recently gaining momentum since it provides a practical pathway for cost reduction as the yield and volume increase. Keeping the vacuum environment in MEMS wafer level packages is really a technical challenge because of the high volume to surface ratio.

Pressure level is a key parameter for the quality of the MEMS devices. The pressure deterioration within a micro cavity is strongly related to the leakage of the packaging structure and the outgassing phenomena. Ultra-high vacuum conditions, such as 10 mTorr or less, for the MEMS packaging can be achieved using the getter technology. This technology utilizes the unique property of getter materials to sorb the residual gases trapped in the device during the manufacturing process and maintains the pressure at a very low level for the required lifetime by limiting the gas flux.

Metals such as zirconium (Zr), titanium (Ti), tantalum (Ta) and yttrium (Y) used in the getters are capable of dissolving their own chemically formed oxides, nitrides and carbides in the solid-state form at elevated temperatures. For example, Zr has a better gettering capability compared to Ti since the gettering effect of pure Ti is very low due to oxidation and other contamination. As a result, commercial getters are primarily Zr-based alloys which can seclude a vacuum level of about 1 mTorr. Nevertheless, Zr powders have high activity and are easily flammable and explosive.

Therefore, there remains a need to provide for alternative getter technology for use MEMS devices to overcome the above problem.

SUMMARY

The inventors have discovered a new technique for forming a layer arrangement without the use of Zr as a getter layer whereby a vacuum level close to 10 mTorr or less could still be attained. Specifically, the inventors make use of surface engineering of the non-Zr (such as Ti) getter layer surface to achieve the vacuum level in the layer arrangement. The surface engineering technique affords optimum coverage of the getter layer surface with a sacrificial layer and also the optimization of the getter material deposition process that would result in a getter film with highly porous or rough appearance. Wafer level MEMS vacuum packaging has been demonstrated by depositing getter films into proper cavities or on the bare cap wafer with increased surface area. The patterned getter film was activated during the bonding of the cap wafer with the other wafer containing the MEMS structure. The activation can also be done during the baking process under vacuum.

Thus, in a first aspect of the invention, there is provided a layer arrangement. The layer arrangement comprises a getter layer and a sacrificial layer disposed substantially over a surface of the getter layer, wherein the sacrificial layer has a negative Gibbs free energy of formation of oxide higher than the getter layer.

In various embodiments, the getter layer comprises a material selected from a group consisting of titanium (Ti), yttrium (Y), vanadium (V), tantalum (Ta), niobium (Nb) and hafnium (Hf) and the sacrificial layer comprises a material selected from a group consisting of nickel (Ni), copper (Cu), zinc (Z), aluminum (Al), iron (Fe) and germanium (Ge).

In one embodiment, the getter layer is Ti and the sacrificial layer is Ni.

In a second aspect of the invention, a method of forming a layer arrangement as disclosed in the first aspect is provided. The method comprises depositing a getter layer and depositing a sacrificial layer substantially over a surface of the getter layer, wherein the sacrificial layer has a negative Gibbs free energy of formation of oxide higher than the getter layer.

In a third aspect of the invention, a wafer level package is provided. The wafer level package comprises a support substrate, a layer arrangement as disclosed in the first aspect disposed on the support substrate, and a capping layer disposed over the support substrate so as to enclose the layer arrangement there within.

BRIEF DESCRIPTION OF THE DRAWINGS

In the drawings, like reference characters generally refer to the same parts throughout the different views. The drawings are not necessarily drawn to scale, emphasis instead generally being placed upon illustrating the principles of various embodiments. In the following description, various embodiments of the invention are described with reference to the following drawings.

DESCRIPTION

Figure 1A:
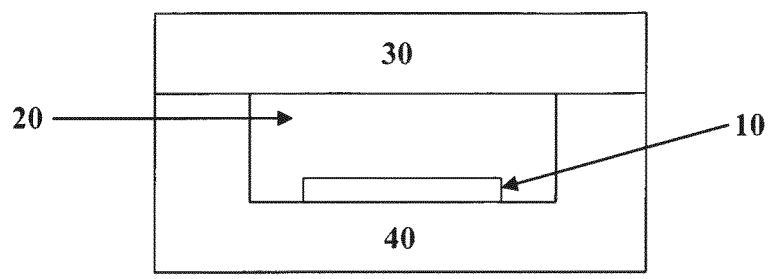
FIG. 1A shows a conventional wafer level package including a getter thin film patterned inside a cavity and subsequently glass cap bonded to a support substrate.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Instead of traditional micro-alloying, surface engineering concept from the materials perspective has been employed to enhance the gas sorption property of a non-Zr (such as Ti) getter material that would enable it to be on par in terms of vacuum level with commercially available Zr-based getter materials. Successful implementation of a sacrificial layer/CMOS compatible layer as a coverage layer over traditional oxidation resistant/corrosion resistant/catalyst over the non-Zr (such as Ti) getter layer has been demonstrated. A new technique for outgassing the process induced Ar has been presented by employing a dense material beneath the porous non-Zr (such as Ti) in addition to the traditionally used baking process. It has been determined that the gettering process could be further improved by optimizing the deposition parameters such as substrate temperature, pressure of the Ar sputtering gas, deposition time, dc sputtering power and glancing angle with the objective to seclude highly porous or rough appearance. The wafer level vacuum packaging could be further improved by increasing the surface area of the patterned thin getter films.

Accordingly, a first aspect of the invention relates to a layer arrangement. The layer arrangement may be included in a wafer level package. The layer arrangement may include a getter layer. The layer arrangement may further include a sacrificial layer. The sacrificial layer may be disposed substantially over a surface of the getter layer. In various embodiments, the sacrificial layer may be disposed at least half of the surface of the getter layer, such as 50%, 55%, 60%, 65%, 70%, 75%, 80%, 85%, 90%, 95% or even the entire surface of the getter layer. The sacrificial layer has a negative Gibbs free energy of formation of oxide higher than the getter layer.

In the present context, getters, or otherwise also known as gas-sorbing materials, are commonly used to control or maintain the pressure inside sealed cavities formed within MEMS devices. The getter materials are capable of sorbing (may be adsorbing or absorbing) molecules such as water vapor, oxygen, hydrogen, carbon oxides and in some cases, nitrogen.

In the present context, the sacrificial layer here refers to a layer containing a metal which possesses a negative Gibbs free energy ($\Delta G$ denotes a change in the Gibbs free energy) of formation of oxide higher than the metal of the getter layer. Gibbs free energy data are frequently presented in graphical forms such as Ellingham diagrams, which is well-established in the industry. Accordingly, a person skilled in the art would understand that if two metals are present, two equilibria have to be considered, so that the oxide with the more negative $\Delta G$ will be formed and the other oxide will get reduced. In one illustration, the getter layer may contain Ti and the sacrificial layer may contain Ni. In this illustration, Ni in the sacrificial layer preferentially oxidizes and ensures that Ti in the getter layer remains essentially in the pure metal state without being oxidized or contaminated.

In various embodiments, the getter layer may include a material selected from a group consisting of titanium (Ti), yttrium (Y), vanadium (V), tantalum (Ta), niobium (Nb) and hafnium (Hf).

While Ti possesses sorption property, Ti has not gained much attraction compared to Zr since in comparison, the gettering effect of Ti is much lower due to oxidation and other contamination. Nevertheless, handling of Ti is relatively easier and safer than handling of Zr. Additionally, Ti-based getter materials are compatible with complementary metal-oxide-semiconductor (CMOS) and are readily available in cleanrooms. Accordingly, in certain embodiments, the getter layer may include Ti.

In various embodiments, the sacrificial layer may include a material selected from a group consisting of nickel (Ni), copper (Cu), zinc (Zn), aluminum (Al), iron (Fe) and germanium (Ge).

In certain embodiments, the sacrificial layer may include Ni.

In one specific embodiment, the layer arrangement may include a getter layer including Ti and may further include a sacrificial layer including Ni, whereby the sacrificial layer including Ni may be disposed substantially over a surface of the getter layer including Ti.

In various embodiments, the getter layer may be formed of a thickness of less than 25 μm. For example, the thickness of the getter layer may be less than 25 μm such as, 24 μm, 23 μm, 22 μm, 21 μm, 20 μm, 19 μm, 18 μm, 17 μm, 16 μm, 15 μm or even lesser such as 5 μm, 4 μm, 3 μm, 2 μm, 1 μm, 0.5 μm or less.

In certain embodiments, the getter layer may be formed of a thickness of 1 μm.

In various embodiments, the sacrificial layer may be formed of a thickness of less than 2 μm. For example, the thickness of the sacrificial layer may be less than 2 μm such as, 1 μm, 500 nm, 400 nm, 300 nm, 200 nm, 100 nm, 95 nm, 90 nm, 85 nm, 80 nm, 75 nm, 70 nm, 65 nm, 60 nm, 55 nm, 50 run, 45 nm, 40 nm, 35 nm, 30 nm, 25 nm, 20 nm, 15 nm, 10 nm or less.

In certain embodiments, the sacrificial layer may be formed of a thickness of 30 nm (i.e. 300 Å).

In one specific embodiment, the layer arrangement may include a getter layer formed of a thickness of 1 μm and may further include a sacrificial layer formed of a thickness of 30 nm.

In various embodiments, the ratio of the thickness of the sacrificial layer relative to the getter layer may be in the range of 0.01 to 0.5, such as 0.01, 0.02, 0.03, 0.04, 0.05, 0.06, 0.07, 0.08, 0.09, 0.1, 0.2, 0.3, 0.4, 0.5 and any value therebetween.

In certain embodiments, the ratio of the thickness of the sacrificial layer relative to the getter layer may be 0.03.

In various embodiments, the layer arrangement may further include a base layer disposed substantially over a further surface of the getter layer. The further surface may be arranged opposite to the surface of the getter layer having the sacrificial layer disposed thereon. In various embodiments, the base layer may be disposed at least half of the further surface of the getter layer, such as 50%, 55%, 60%, 65%, 70%, 75%, 80%, 85%, 90%, 95% or even the entire further surface of the getter layer.

In various embodiments, the base layer may include a material of higher density than the getter layer.

In various embodiments, the base layer may include a material selected from a group consisting of nickel, tungsten, copper, chromium, cobalt, silver, platinum, palladium and iron.

In certain embodiments, the base layer may include Ni.

In one specific embodiment, the layer arrangement may include a getter layer including Ti and may further include a sacrificial layer including Ni, whereby the sacrificial layer including Ni may be disposed substantially over a surface of the getter layer including Ti, and may further include a base layer including Ni disposed substantially over a further surface of the getter layer including Ti.

According to a second aspect of the invention, a method of forming a layer arrangement of the first aspect is disclosed. The method may include depositing a getter layer and depositing a sacrificial layer substantially over a surface of the getter layer. The sacrificial layer has a negative Gibbs free energy of formation of oxide higher than the getter layer.

In various embodiments, the method may further include introducing argon (Ar) when depositing the getter layer.

In various embodiments, the step of depositing the getter layer may include depositing the getter layer by sputtering or evaporation. The step of depositing the getter layer may be optimized by varying one or a combination of the deposition parameters selected from the group consisting of substrate temperature, pressure of the argon sputtering gas, deposition time, dc sputtering power and glancing angle.

In various embodiments, the step of depositing the sacrificial layer may include depositing the sacrificial layer by sputtering or evaporation.

In various embodiments, the method may further include baking the getter layer and the sacrificial layer before activation of the getter layer. The getter layer may be activated by heating, for example, at temperatures lower than 800° C., 700° C., 600° C., 500° C., 400° C., 300° C., 200° C., or lower.

In various embodiments, the method may further include depositing a base layer over a further surface of the getter layer, the further surface being arranged opposite to the surface of the getter layer. The step of depositing the base layer may include depositing the base layer by sputtering or evaporation.

In various embodiments, the step of depositing the base layer comprises depositing the base layer with high power of more than 1 kW, such as 1 kW, 2kW, 3kW, or more.

In various embodiments, the step of depositing the base layer comprises depositing the base layer with Ar gas flow of more than 100 standard cubic centimeter per minute (SCCM), such as 100 SCCM, 150 SCCM, 200 SCCM, 250 SCCM, 300 SCCM, or more.

In a third aspect of the invention, a wafer level package including a layer arrangement of the first aspect is disclosed. The wafer level package may include a support substrate, a layer arrangement as disclosed in the first aspect disposed on the support substrate, and a capping layer disposed over the support substrate so as to enclose the layer arrangement there within.

In the present context, by enclosing the layer arrangement there within the support substrate is meant hermetically sealing the layer arrangement there within. In various embodiments, the capping layer may be bonded to the support substrate so as to enclose the layer arrangement there within.

In various embodiments, the support substrate may include a cavity formed there within.

In various embodiments, the layer arrangement may be disposed within the cavity. For example, the layer arrangement may be disposed such that the layer arrangement is centrally disposed within the cavity. Alternatively, the layer arrangement may be disposed towards or at one side of the cavity.

In various embodiments, the layer arrangement may be disposed in contact with a base surface or disposed in contact with a base surface and sidewalls of the cavity. For example, the layer arrangement may be disposed in contact with a base surface and a portion of a sidewall of the cavity. Alternatively, the layer arrangement may be disposed in contact with a base surface and the entire portion of the sidewall of the cavity.

In various embodiments, the support substrate may include a substrate selected from a group consisting of a silicon substrate, a ceramic substrate with metallization, and a ceramic substrate without metallization.

In certain embodiments, the support substrate may include a silicon substrate.

In various embodiments, the capping layer may include a material selected from a group consisting of glass, glass-ceramic, silicon, ceramic with metallization and ceramic without metallization.

In certain embodiments, the capping layer may include glass. The glass cap may, for example, be anodic bonded to the support substrate.

In specific embodiments, the wafer level package may include a silicon support substrate. The wafer level package may further include a layer arrangement including a Ti getter layer and the layer arrangement may further include a Ni sacrificial layer, whereby the Ni sacrificial layer may be disposed substantially over a surface of the Ti getter layer, and may optionally include a Ni base layer disposed substantially over a further surface of the Ti getter layer. The wafer level package may further include a glass capping layer disposed over the silicon support substrate so as to enclose the layer arrangement there within.

In summary, Ti possesses sorption property. Handling Ti is relatively easier and safe. However, Ti has not gained attraction since the gettering effect of Ti is very low due to oxidation and other contamination. In present disclosure, the sorption characteristic of Ti has been enhanced on par (less than 10 mTorr and potentially close to 1 mTorr) with the commercial Zr-based alloys by covering the Ti surface with a sacrificial layer of optimum thickness. The criterion for the sacrificial layer is that it should possess relatively higher negative Gibbs free energy for the formation of oxides when compared to Ti. Ni has been identified as an appropriate sacrificial layer. Ni oxidizes and ensures that the inner Ti remains in the pure metal state without being oxidized or contaminated.

It has also been determined that the gettering effect of Ti could be further improved by the optimization of Ti deposition process with the objective to secure a getter film with highly porous or rough appearance. Thin film getter with highly porous or rough appearance is highly desirable because of their high adsorption characteristic even at room temperature due to the large available surface for the sorption process. The deposition parameters that may be independently fine-tuned for this purpose are as follows: substrate temperature, pressure of the Ar sputtering gas, deposition time, dc sputtering power and glancing angle.

The approach practiced in this invention would facilitate process integration and miniaturization drive and thereby, facilitate the reduction in fabrication costs and time. Accordingly, this approach finds particular use in wafer level MEMS vacuum packaging such as vacuum packaging of MEMS devices with moving parts, for example, resonators, oscillators, accelerometers, gyroscopes and infrared sensors.

The present invention affords at least the following advantages over commercially available Zr-based alloy getter materials:
(i) Cost effectiveness: surface engineering is more economical than micro-alloying used in forming the Zr-based alloy getter materials
(ii) Process flexibility and a reduction in number of process steps
(iii) Non-Zr based getter materials such as titanium, yttrium, vanadium, tantalum, niobium and hafnium are relatively safe material while Zr is easily flammable and explosive
(iv) The getter and sacrificial layer materials are CMOS compatible and thereby facilitates the integration of MEMS devices with driving, controlling and signal processing electronics Although much emphasis and illustrations have been given to titanium as a getter layer and nickel as a sacrificial layer, it is to be understood and appreciated that the getter layer material and the sacrificial layer material are not restricted to such.

In order that the invention may be readily understood and put into practical effect, particular embodiments will now be described by way of the following non-limiting examples.

EXAMPLES

Example 1

Employment of Sacrificial Layer Over Ti

As shown in FIG. 1A, a patterned 1 µm Ti thin film 10 is placed inside a cavity 20 on a silicon wafer 40. A glass cap 30 is subsequently bonded by anodic bonding to seal the cavity 20. Residual gas analysis (RGA) results of samples without a getter layer and with a Ti getter layer have been illustrated in Tables 1a and 1b, respectively. It is apparent from Tables 1a and 1b that significant improvement in the vacuum level could not be attained by the employment of the Ti getter layer alone. Inert gases cannot be absorbed by any getter material. Hence, the Ti getter layer is not expected to absorb the process-induced inert Ar gas. Moreover, the Ti getter layer could not even fully absorb gases like $H_2$, CO, $CO_2$ and $C_2H_6$ which is normally anticipated from an ideal getter. This could be probably attributed to the oxidation or contamination of the pure Ti getter material.

TABLE 1

Residual gas analysis results of (a) without getter sample (b) 1 µm Ti getter sample (a)

| | Without getter | |
|---|---|---|
| Gas | Pressure (mbar) | % |
| $H_2$ | 5.37E−01 | 74.09% |
| He | 0.00E+00 | 0.00% |
| CO | 1.36E−02 | 1.88% |
| $N_2$ | 0.00E+00 | 0.00% |
| $CH_4$ | 1.51E−01 | 20.83% |
| $H_2O$ | 0.00E+00 | 0.00% |
| $O_2$ | 0.00E+00 | 0.00% |
| $C_2H_6$ | 1.23E−02 | 1.69% |
| $C_3H_8$ | 4.44E−03 | 0.61% |

TABLE 1-continued

Residual gas analysis results of (a) without getter sample (b) 1 µm Ti getter sample

| Ar | 7.87E−04 | 0.11% |
|---|---|---|
| $CO_2$ | 5.72E−03 | 0.79% |
| Kr | 0.00E+00 | 0.00% |
| TOT | 7.25E−01 | 100.00% |

(b)

| | Ti 1 um | |
|---|---|---|
| Gas | Pressure (mbar) | % |
| $H_2$ | 4.17E−02 | 8.74% |
| He | 1.83E−03 | 0.38% |
| CO | 5.23E−03 | 1.09% |
| $N_2$ | 0.00E+00 | 0.00% |
| $CH_4$ | 4.65E−03 | 0.97% |
| $H_2O$ | 0.00E+00 | 0.00% |
| $O_2$ | 0.00E+00 | 0.00% |
| $C_2H_6$ | 5.52E−04 | 0.12% |
| $C_3H_8$ | 0.00E+00 | 0.00% |
| Ar | 4.21E−01 | 88.03% |
| $CO_2$ | 3.19E−03 | 0.67% |
| Kr | 0.00E+00 | 0.00% |
| TOT | 4.78E−01 | 100.00% |

It has been determined that the sorption property of Ti could be enhanced on par with the commercial getters by covering 1 µm thin Ti getter film with a sacrificial layer. The criterion for the sacrificial layer is that it should possess a very high negative Gibbs free energy for the formation of oxides when compared to Ti. The impact of employing a sacrificial layer over Ti surface has been demonstrated by using Ni sacrificial layer. Ni film oxidizes easily since its enthalpy of formation ($\Delta H^{form}$) at room temperature −120 kJ/mole for NiO. However, interior Ti getter remains in the pure metal state since Ni layer is being sacrificed in order to refrain Ti from being contaminated or oxidized. Therefore, the Ti getter film with a sacrificial layer is more effective in terms of providing a gettering effect.

Figure 1B:
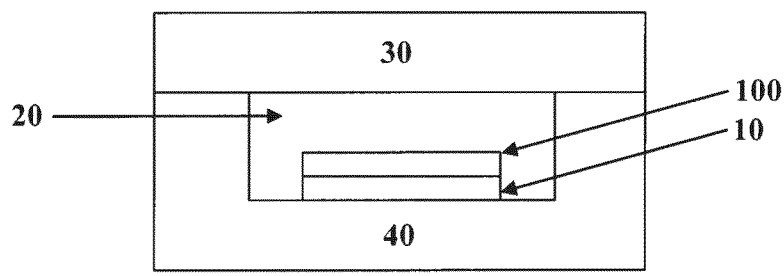
FIG. 1B shows an embodiment of the present wafer level package including a getter layer and a sacrificial layer deposited sequentially in a cavity of a support substrate, whereby the sacrificial layer is disposed substantially over a surface of the getter layer.

As shown in FIG. 1B, a 1 µm Ti thin getter film 10 and a 300 Å Ni sacrificial layer 100 are deposited sequentially in a cavity 20 of a silicon wafer 40 using Innotec ES26C E-beam evaporator in a single pump down. The cavity 20 with the patterned Ti getter film 10 is then sealed with a glass cap 30 via anodic bonding. The RGA result shown in Table 2 confirms the substantial improvement in terms of gettering by the employment of the Ni sacrificial layer. All the other gases other than the inert gasses have been successfully absorbed by the Ti getter covered by the sacrificial layer. Thus, the 300 Å Ni sacrificial layer has transformed the non-performing Ti thin film getter into an ideal getter on par with the commercial getters. Baking process prior to bonding can be introduced in order to facilitate the outgassing of process-induced inert gases, in particular, argon (Ar) gas.

TABLE 2

Residual gas analysis results of Ti 1 µm/Ni 300 Å sample.

| | Ti 1 um/Ni 300 Å | |
|---|---|---|
| Gas | Pressure (mbar) | % |
| $H_2$ | 0.00E+00 | 0.00% |
| He | 1.76E−03 | 42.41% |

TABLE 2-continued

Residual gas analysis results of Ti 1 μm/Ni 300 Å sample.

| | Ti 1 μm/Ni 300 Å | |
| --- | --- | --- |
| Gas | Pressure (mbar) | % |
| CO | 0.00E+00 | 0.00% |
| $N_2$ | 0.00E+00 | 0.00% |
| $CH_4$ | 0.00E+00 | 0.00% |
| H2O | 0.00E+00 | 0.00% |
| O2 | 0.00E+00 | 0.00% |
| $C_2H_6$ | 0.00E+00 | 0.00% |
| $C_3H_8$ | 0.00E+00 | 0.00% |
| Ar | 2.38E−03 | 57.59% |
| $CO_2$ | 0.00E+00 | 0.00% |
| Kr | 0.00E+00 | 0.00% |
| TOT | 4.14E−03 | 100.00% |

The Ni sacrificial layer also has an advantage of being CMOS compatible. CMOS compatible MEMS packaging is generally preferred since it facilitates the integration of MEMS devices with driving, controlling and signal processing electronics and thereby, improves performance, lowers manufacturing costs and allows for the individual development of the micromechanics and microelectronics technology.

Example 2

Better Performance of Sacrificial Layer Over Corrosion/Oxidation Resistant Layer The uniqueness of the invention is that it has been proven that the gettering performance will be largely enhanced by the employment of sacrificial layer over titanium when compared to the employment of corrosion/oxidation resistant material over titanium (i.e. provision of a sacrificial layer versus provision of a protective layer). The general conception is that the employment of corrosion/oxidation resistant material over getter material would serve as a good protective layer. In this invention, supported by residual gas analysis results, it has been proven that the employment of sacrificial layer would serve as an even better protective layer. As mentioned above, a sacrificial layer here refers to any material that easily oxidizes when compared to the getter material. In this context, a material can be qualified as a sacrificial layer, if it possesses a higher negative Gibbs free energy of formation of oxides when compared to the getter material. This concept has been illustrated by the employment of nickel sacrificial layer over titanium getter material and the performance is compared with that of a noble metal protective layer, such as gold (Au) or platinum (Pt) over titanium getter material. The same thickness of the sacrificial layer and protective layer is used. The device arrangement is similar to that shown in FIG. 1B, except that in place of the sacrificial layer 100, a protective layer of Au is deposited on the Ti getter layer 10. The RGA result of 1 μm Ti/300 Å Au is shown in Table 3.

TABLE 3

Residual gas analysis results of 1 μm Ti/300 Å Au sample.

| | Ti 1 μm - Au 300 A° | |
| --- | --- | --- |
| Gas | Pressure (mbar) | % |
| $H_2$ | 0.00E+00 | 0.00% |
| He | 1.28E−03 | 1.99% |
| CO | 4.60E−04 | 0.72% |
| $N_2$ | 0.00E+00 | 0.00% |
| $CH_4$ | 0.00E+00 | 0.00% |
| $H_2O$ | 0.00E+00 | 0.00% |
| $O_2$ | 0.00E+00 | 0.00% |
| $C_2H_6$ | 0.00E+00 | 0.00% |
| $C_3H_8$ | 0.00E+00 | 0.00% |
| Ar | 6.22E−02 | 96.92% |
| $CO_2$ | 2.38E−04 | 0.37% |
| Kr | 0.00E+00 | 0.00% |
| TOT | 6.42E−02 | 100.00% |

Example 3

Optimization of the Getter Deposition Process

Figure 2A:
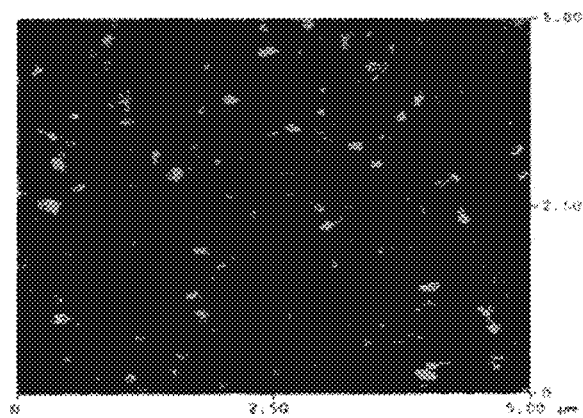
FIG. 2A shows atomic force microscopy (AFM) micrographs of Ti surface subjected to a getter bonding process parameters of power: 3 kW and Ar gas flow: 300 SCCM.
Figure 2B:
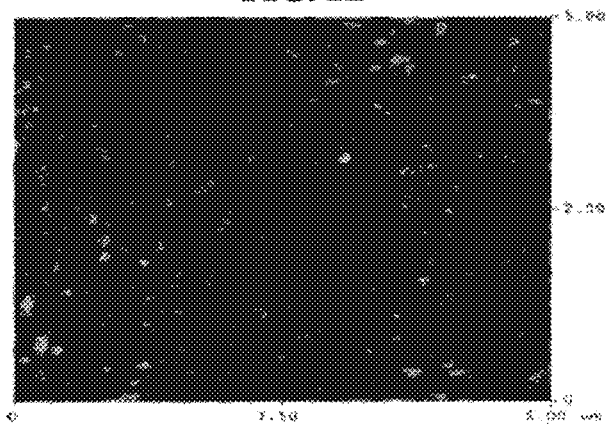
FIG. 2B shows AFM micrographs of Ti surface subjected to a getter bonding process parameters of power: 1 kW and Ar gas flow: 300 SCCM.
Figure 2C:
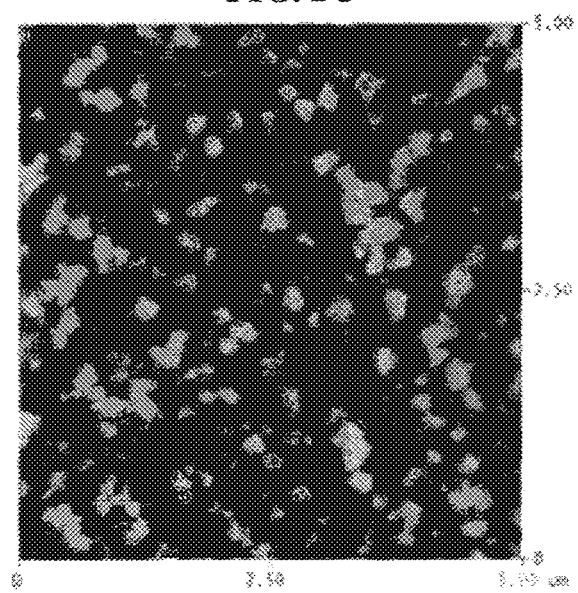
FIG. 2C shows AFM micrographs of Ti surface subjected to a getter bonding process parameters of power: 1 kW and Ar gas flow: 100 SCCM.

It has been determined that the gas sorption property of Ti could be further improved by optimizing the getter deposition process with the objective of secluding highly porous/rough Ti surface. The deposition parameters that may be independently fine-tuned for secluding porous or rough surface include: substrate temperature, pressure of the Ar sputtering gas, deposition time, dc sputtering power and glancing angle. It has been determined that low power, slow Ar gas flow results in a porous surface. This was confirmed by analyzing the Ti surface under atomic force microscopy. The AFM micrographs of the Ti surface subjected to different getter deposition process parameters are illustrated in FIGS. 2A, 2B and 2C. FIG. 2A shows AFM micrographs of Ti surface subjected to a getter bonding process parameters of power: 3 kW and Ar gas flow: 300 SCCM. FIG. 2B shows AFM micrographs of Ti surface subjected to a getter bonding process parameters of power: 1 kW and Ar gas flow: 300 SCCM. FIG. 2C shows AFM micrographs of Ti surface subjected to a getter bonding process parameters of power: 1 kW and Ar gas flow: 100 SCCM. Thus, it has been demonstrated that the getter process deposition parameters influence the roughness of the Ti surface which in turn has an impact on the sorption property.

Example 4

Ar Outgassing

Getter materials cannot absorb inert gases. Inert materials in particular Ar are introduced during the getter deposition process. Conventionally, wafers are baked at 150° C. to 250° C. for about 30 minutes to 3 hours prior to getter activation in order to facilitate the outgassing of Ar. It is essential that the baking temperature is lower than the getter activation temperature. The getter activation temperature is normally around 300° C. Frequent baking process may be essential depending upon the type of wafer-level bonding mechanism. Despite baking prior to bonding, the probability of re-outgassing of Ar still persists due to the porous nature of the Ti getter surface.

A novel concept for tackling the re-outgassing of Ar problem has been surprisingly discovered by the inventors. Stacking of a dense material base layer deposited with high power beneath the porous Ti layer will avert the re-outgassing of Ar. This concept can be demonstrated by using Ni since it is dense as well as CMOS compatible.

Figure 1C:
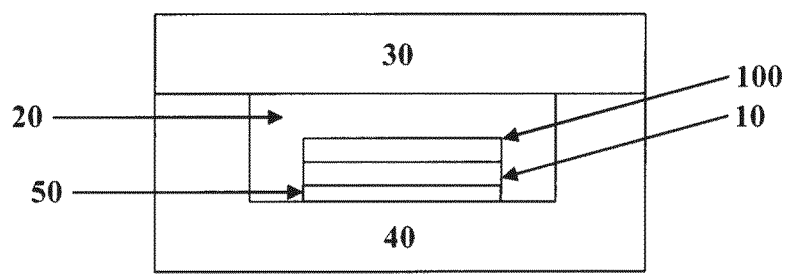
FIG. 1C shows an embodiment of the present wafer level package including a getter layer and a sacrificial layer deposited sequentially in a cavity of a support substrate, whereby the sacrificial layer is disposed substantially over a surface of the getter layer, and the layer arrangement further includes a base layer disposed substantially over a further surface of the getter layer, the further surface being arranged opposite to the surface of the getter layer.

A 1 μm Ni base layer 50 deposited with high power and a 1 μm Ti getter layer 10 deposited with low power and a 300 Å Ni sacrificial layer 100 are deposited sequentially in a cavity 20 of a silicon wafer 40 using Innotec ES26C E-beam evaporator in a single pump down. Subsequently, the cavity 20 with the patterned getter films 10 is sealed with a glass cap 30 by anodic bonding as shown in FIG. 1C.

Example 5

Vacuum Level During Getter Activation

It has been determined that the vacuum inside the bonding chamber at the time of getter activation too has an impact on the overall performance of the getter. The 1 μm Ti getter thin film covered by 300 Å Ni sacrificial layer is exposed to two different vacuum conditions during getter activation. It was determined that the performance of the getter activated inside the bonding chamber with a base pressure 1×10E-3 mbar is slightly better than the one activated inside the bond chamber with a base pressure 6×10E-3 mbar (Table 4). It has to be noted that the getter was activated at 1×10E-3 mbar since it is the highest possible vacuum level that could be attained with the current EVG wafer bonder in the research facilities of the inventors. It is to be appreciated that ultra-high vacuum level, i.e. in the range of 1×10E-5 mbar could be attained by newer versions of wafer bonder. Thus, the employment of newer versions of the wafer bonder for the activation of getter is expected to result in even better performance of the getter material.

TABLE 4

Residual gas analysis results of 1 μm Ti/300 Å Ni sample subjected to different vacuum levels during getter activation (a) 6 × 10E-3 mbar (b) 1 × 10E-3 mbar.

(a)

Ti 1 um/Ni 300° A

| Gas | Pressure (mbar) | % |
|---|---|---|
| $H_2$ | 0.00E+00 | 0.00% |
| He | 8.77E-04 | 10.28% |
| CO | 6.35E-04 | 7.44% |
| $N_2$ | 3.93E-03 | 46.12% |
| $CH_4$ | 0.00E+00 | 0.00% |
| $H_2O$ | 0.00E+00 | 0.00% |
| $O_2$ | 0.00E+00 | 0.00% |
| $C_2H_6$ | 0.00E+00 | 0.00% |
| $C_3H_8$ | 0.00E+00 | 0.00% |
| Ar | 2.67E-03 | 31.30% |
| $CO_2$ | 4.14E-04 | 4.85% |
| Kr | 0.00E+00 | 0.00% |
| TOT | 8.53E-03 | 100.00% |

(b)

Ti 1 μm/Ni 300 Å

| Gas | Pressure (mbar) | % |
|---|---|---|
| $H_2$ | 0.00E+00 | 0.00% |
| He | 1.76E-03 | 42.41% |
| CO | 0.00E+00 | 0.00% |

TABLE 4-continued

Residual gas analysis results of 1 μm Ti/300 Å Ni sample subjected to different vacuum levels during getter activation (a) 6 × 10E-3 mbar (b) 1 × 10E-3 mbar.

| | | |
|---|---|---|
| $N_2$ | 0.00E+00 | 0.00% |
| $CH_4$ | 0.00E+00 | 0.00% |
| $H_2O$ | 0.00E+00 | 0.00% |
| $O_2$ | 0.00E+00 | 0.00% |
| $C_2H_6$ | 0.00E+00 | 0.00% |
| $C_3H_8$ | 0.00E+00 | 0.00% |
| Ar | 2.38E-03 | 57.59% |
| $CO_2$ | 0.00E+00 | 0.00% |
| Kr | 0.00E+00 | 0.00% |
| TOT | 4.14E-03 | 100.00% |

The ideal performance of a getter i.e. absorbing all the gases other than the inert gases was secured only when the 1 μm Ti getter thin film covered by 300 Å Ni sacrificial layer was activated in a relatively high vacuum environment. The one activated in a relatively low vacuum environment resulted in gases like He, CO, $N_2$ and $CO_2$ being only partially absorbed. Thus, the above RGA (Table 4) results confirm that the sorption property of the Ti getter covered by Ni sacrificial layer could be secured to the fullest extent only when it is activated in a high vacuum environment.

Example 6

Patterned Getter Films with an Increased Surface Area

Wafer level MEMS packaging is recently gaining momentum since it provides a practical pathway for cost reduction as the yield and volume increase. Keeping the vacuum environment in MEMS wafer level packages is really a technical challenge because of the high volume to surface ratio. The real and innovative technical solution for wafer to wafer bonded MEMS is to have silicon or glass cap wafer with patterned getter film into proper cavities or on the bare cap wafer.

The advantage of this technical approach is the fact that the getter film is selectively placed into cavities with good adhesion and no loose particles by semiconductor like technologies. The patterned getter film can be activated during the baking under vacuum and during the bonding of the cap wafer with the other wafer containing the MEMS structure. The different vacuum bonding technologies such as anodic bonding, eutectic bonding, direct bonding and frit glass bonding offer a suitable range of temperature and process time for proper activation of getter film. The getter film has been proven not to change its morphology after the activation conditions of various bonding technologies.

The performance of gettering effect can be improved by increasing the surface area of the patterned getter films inside the cavity. Increasing the surface area of the patterned getter film to the fullest extent inside the cavity would proportionally improve the sorption property of the getter film. This also includes patterning the getter film even on the sidewalls of the cavity. Hence, the resultant gettering effect of the patterned Ti getter film even on the sidewalls of the cavity possesses better sorption property than a conventionally patterned Ti getter film deposited merely on the silicon wafer. Alternatively, the gettering performance can be improved by increasing the surface area of the patterned getter film on the bare cap wafer instead of patterning it inside the cavity. Best gettering performance can be secluded by patterning the getter film with increased surface area on both inside the cavity including the sidewalls of the cavity as well as on the cap wafer.

Figure 1D:
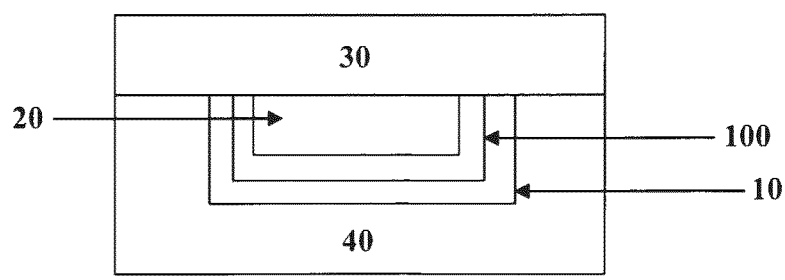
FIG. 1D shows an embodiment of the present wafer level package including a getter layer and a sacrificial layer deposited sequentially in a cavity of a support substrate, whereby the sacrificial layer is disposed substantially over a surface of the getter layer and the getter layer is disposed in contact with a base surface and sidewalls of the cavity.

As discussed earlier, the gettering effect of Ti is very low due to oxidation and other contamination. The sorption property of Ti could be significantly improved by covering it with a sacrificial layer. This sorption property could be further enhanced and the same could be sustained reliably for a longer period by patterning the 1 μm Ti getter film covered by a 300 Å Ni sacrificial layer with an increased surface area. The increase in surface area of the patterned thin getter film could be either reflected inside the cavity by patterning thin getter film even on the walls of the cavity or on the bare cap wafer (see FIG. 1D).

By "comprising" it is meant including, but not limited to, whatever follows the word "comprising". Thus, use of the term "comprising" indicates that the listed elements are required or mandatory, but that other elements are optional and may or may not be present.

By "consisting of" is meant including, and limited to, whatever follows the phrase "consisting of". Thus, the phrase "consisting of" indicates that the listed elements are required or mandatory, and that no other elements may be present.

The inventions illustratively described herein may suitably be practiced in the absence of any element or elements, limitation or limitations, not specifically disclosed herein. Thus, for example, the terms "comprising", "including", "containing", etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the inventions embodied therein herein disclosed may be resorted to by those skilled in the art, and that such modifications and variations are considered to be within the scope of this invention.

By "about" in relation to a given numerical value, such as for temperature and period of time, it is meant to include numerical values within 10% of the specified value.

The invention has been described broadly and generically herein. Each of the narrower species and sub-generic groupings falling within the generic disclosure also form part of the invention. This includes the generic description of the invention with a proviso or negative limitation removing any subject matter from the genus, regardless of whether or not the excised material is specifically recited herein.

Other embodiments are within the following claims and non-limiting examples. In addition, where features or aspects of the invention are described in terms of Markush groups, those skilled in the art will recognize that the invention is also thereby described in terms of any individual member or subgroup of members of the Markush group.

The invention claimed is:

1. A layer arrangement comprising:
    a getter layer provided on a support substrate; and
    a sacrificial layer disposed substantially over the getter layer;
    wherein the sacrificial layer has a negative Gibbs free energy of formation of oxide higher than the getter layer.

2. The layer arrangement of claim 1,
    wherein the getter layer comprises a material selected from a group consisting of titanium, yttrium, vanadium, tantalum, niobium and hafnium.

3. The layer arrangement of claim 1,
    wherein the sacrificial layer comprises a material selected from a group consisting of nickel, copper, zinc, aluminum, iron and germanium.

4. The layer arrangement of claim 1, wherein the getter layer comprises a thickness less than 25 μm, the sacrificial layer comprises a thickness less than 2 μm, and wherein the ratio of the thickness of the sacrificial layer relative to the getter layer is in the range of 0.01 to 0.5.

5. The layer arrangement of claim 1, further comprising a base layer beneath the getter layer, the base layer capable for averting a re-outgassing of argon.

6. The layer arrangement of claim 5, wherein the base layer comprises a material of higher density than the getter layer, and wherein the base layer comprises a material selected from a group consisting of nickel, tungsten, copper, chromium, cobalt, silver, platinum, palladium and iron.

7. The layer arrangement of claim 1, wherein the getter layer comprises titanium and the sacrificial layer comprises any one of nickel or germanium.

8. A wafer level package comprising
    a support substrate;
    a layer arrangement disposed on the support substrate, the layer arrangement comprising:
        a getter layer;
        a sacrificial layer disposed substantially over a surface of the getter layer;
        wherein the sacrificial layer has a negative Gibbs free energy of formation of oxide higher than the getter layer; and
    a capping layer disposed over the support substrate so as to enclose the layer arrangement there within.

9. The wafer level package of claim 8, wherein the support substrate comprises a cavity formed there within, and wherein the layer arrangement is disposed within the cavity.

10. The wafer level package of claim 8, wherein the layer arrangement is disposed in contact with one or more of surfaces of the support substrate, the capping layer, and sidewalls of the cavity.

11. The wafer level package of claim 8, wherein the support substrate comprises a substrate selected from a group consisting of a silicon substrate, a ceramic substrate with metallization, and a ceramic substrate without metallization.

12. The wafer level package of claim 8, wherein the capping layer comprises a material selected from a group consisting of glass, glass-ceramic, silicon, ceramic with metallization and ceramic without metallization.

13. The wafer level package of claim 8, wherein the capping layer is bonded to the support substrate.

14. A method of forming a layer arrangement, the method comprising:
    depositing a getter layer on a support substrate; and
    depositing a sacrificial layer substantially over the getter layer;
    wherein the sacrificial layer has a negative Gibbs free energy of formation of oxide higher than the getter layer.

15. The method of claim 14, further comprising introducing argon when depositing the getter layer.

16. The method of claim 14, wherein depositing the getter layer comprises depositing by sputtering or evaporation.

17. The method of claim 14,
    wherein depositing the getter layer is optimized by varying one or a combination of the deposition parameters selected from the group consisting of substrate temperature, pressure of the argon sputtering gas, deposition time, dc sputtering power and glancing angle.

18. The method of claim 17, wherein depositing the getter layer is optimized by varying a combination of the deposition parameters of pressure of the argon sputtering gas and dc sputtering power.

19. The method of claim 14, further comprising baking the getter layer and the sacrificial layer before activation of the getter layer to facilitate the outgassing of argon, and wherein the baking temperature is in the range of 150° C. to 250° C.

20. The method of claim 14, further comprising depositing a base layer beneath the getter layer, the base layer capable for averting the re-outgassing of inert gas.

* * * * *